United States Patent [19]

Fritz

[11] Patent Number: 5,030,924
[45] Date of Patent: Jul. 9, 1991

[54] TEMPERATURE COMPENSATED EXPONENTIAL GAIN CONTROL CIRCUIT

[75] Inventor: Scott N. Fritz, Penn Valley, Calif.

[73] Assignee: Silicon Systems, Inc., Tustin, Calif.

[21] Appl. No.: 331,613

[22] Filed: Mar. 30, 1989

[51] Int. Cl.$^5$ .............................................. H03F 3/45
[52] U.S. Cl. ..................................... 330/256; 330/289
[58] Field of Search ............... 307/491, 492, 493, 494; 330/252, 254, 256, 278, 289, 310, 311

[56] References Cited

U.S. PATENT DOCUMENTS

| 3,676,789 | 7/1972 | Bray | 330/254 X |
| 3,723,896 | 3/1973 | Flickinger | 330/256 X |
| 3,928,774 | 12/1975 | Wilson | 307/493 |

FOREIGN PATENT DOCUMENTS 0196906 10/1986 European Pat. Off. .
2219898 12/1989 United Kingdom .

Primary Examiner—Steven Mottola
Attorney, Agent, or Firm—Hecker & Harriman

[57] ABSTRACT

The present invention is directed to apparatus for providing temperature compensated exponential gain voltage to an AGC amplifier. The present invention uses emitter coupled pairs of transistors to implement an exponential gain control function. The present invention adds additional circuitry to drive the bases of the transistor pairs. The additional circuitry adds one gain stage in which the bias current is proportional to temperature and a second gain stage with a bias current which is constant over temperature. These gain stages, in combination with the transistor pairs, have no temperature dependence and retain the exponential gain function. This circuitry of the present invention allows a user to set the gain of the amplifier by an external voltage source providing a gain which is temperature independent. An advantage of the present invention is the cancellation of temperature dependence without the use of any temperature sensitive components. In addition, the circuitry of the present invention may used by any bipolar process.

15 Claims, 2 Drawing Sheets

TEMPERATURE COMPENSATED EXPONENTIAL GAIN CONTROL CIRCUIT

BACKGROUND OF THE PRESENT INVENTION

1. Field of the Present Invention

This invention relates to the field of integrated circuits and in particular to a temperature compensated exponential gain control voltage for an automatic gain control (AGC) amplifier.

2. Background Art

Automatic gain control circuits are used to maintain a constant amplitude signal output level regardless of the level of an input signal. In other words, although the amplitude of an input signal level may vary, the output of the AGC circuit is a constant amplitude. Whereas a typical electronic amplifier accepts a incoming electronic signal and amplifies that signal by a fixed amount, a AGC provides only enough amplification, or "gain", to reach the desired amplitude level.

One use for AGC circuits is in the read channels, such as found in a disk drive or similar application. Signals picked up off the magnetic media varying in amplitude are amplified by a head amplifier and then provided to the AGC circuit. It is desired that the input signal be amplified to a fixed level for subsequent processing and decoding. Therefore, the AGC amplifies the input signals to a fixed output level.

In operation the gain of an AGC circuit amplifier stage varies inversely to the amplitude of the input signal level. As the amplitude of the input signal increases, the amount of gain is reduced. The AGC is initialized at a predetermined reference level which the AGC seeks to maintain. When the amplitude signal falls below this predetermined threshold level, the AGC circuit senses the decrease in amplitude at the output of the amplifier. The AGC circuit then increases the amplifier stage gain until the amplitude of the output signal increases to the reference level. If the amplitude of the input signal is above the nominal reference level, the AGC circuit senses the increase in amplitude at the output of the amplifier stage and decreases the amplifier stage gain until the amplitude of the output signal decreases to the reference level.

A typical AGC circuit consists of an input stage for receiving a input signal. The input signal is provided to an amplifying stage where it is multiplied by a gain factor to increase the amplitude of the input signal. This amplifying stage produces an output signal of the circuit. A detection stage detects the amplitude of the output signal and compares it to a reference level or a reference range. If the amplitude of the input signal is not at the desired level, a error signal is provided to a correction stage which adjusts the gain of the amplifying stage so that the amplitude of the output signal is at or within the desired range. In some prior art implementations, a switched capacitor array is utilized to provide variable gain such as is described in U.S. Pat. No. 4,691,172 assigned to the assignee to the present invention.

The gain versus input control voltage for a typical AGC amplifier is usually an exponential function which is required in the feedback loop characteristics to achieve a rapid gain settling time. In the prior art, the exponential function is implemented using a emitter coupled pair of transistors in a configuration such as a Gilbert Multiplier. One disadvantage of such an implementation is that the exponential function is highly temperature variant. If a user wishes to drive this voltage with a digital-to-analog converter (DAC), then the DAC would also have to have the same temperature variation to compensate. If one voltage is not compensated, the temperature dependency results in the requirement that the user must supply different voltages to get a specific gain over a temperature range. This adds complexity to the circuitry and software.

Therefore, it is an object of the present invention to provide an automatic gain control circuit in which gain versus input control voltage is temperature independent.

It is yet another object of the present invention to provide an automatic gain control circuit with reduced circuitry and software requirements.

SUMMARY OF THE PRESENT INVENTION

The present invention is directed to apparatus for providing temperature compensated exponential gain voltage to an AGC amplifier. The present invention uses emitter coupled pairs of transistors to implement an exponential gain control function. The present invention adds additional circuitry to drive the bases of the transistor pairs. The additional circuitry adds, in the control path, a gain stage in which the bias current is proportional to temperature and a second gain stage with a bias current which is constant over temperature. These gain stages, in combination with the transistor pairs, have no temperature dependence and retain the exponential gain function. This circuitry of the present invention allows a user to set the gain of the amplifier by an external voltage source providing a gain which is temperature independent.

An advantage of the present invention is the cancellation of temperature dependence without the use of any temperature sensitive components. In addition, the circuitry of the present invention may be used by any bipolar process.

Another advantage of the present invention is that by careful ratioing of the resistors, a gain clamp can be implemented thus keeping the amplifier out of the parasitic non-exponentional region of the Gilbert multiplier.

DETAILED DESCRIPTION OF THE PRESENT INVENTION

The present invention is directed to an apparatus for providing temperature compensated exponential gain control voltage to an AGC amplifier. In the following description, numerous specific details, such as voltage, conductivity type, etc. are set forth in order to provide a more thorough understanding of the present invention. It will be apparent, however, to one skilled in the art, that the present invention may be practiced without these specific details. In other instances, well known features have not been described in detail in order not to obscure the present invention.

The present invention provides a circuit which allows a user to externally set the gain of an AGC amplifier via digital to analog converter (DAC) or other voltage source. The present invention does not require any special temperature sensitive components for the voltage control circuitry.

The gain of a prior art AGC is given by a exponential function in which the exponent consists of a ratio value. The denominator of the ratio is temperature dependent, resulting in the gain being temperature dependent. The present invention provides voltage control circuitry which results in a numerator of the exponential ratio being temperature dependent as well. As a result, voltage variations due to temperature changes are cancelled out and the gain becomes temperature independent.

In the prior art, the exponential function is provided by using emitter coupled pair transistors such as a Gilbert Multiplier. This acts as a differential amplifier with inputs IN PLUS, IN MINUS and outputs OUT PLUS and OUT MINUS. The gain control voltage is applied to the transistor pair at an input referred to for purposes of the present application as BYP. As long as the prior art circuit operates in a closed loop environment, the loop compensates for any temperature induced gain variations. However, if a user wishes to drive a circuit with a external control voltage such as from a DAC or other controlled voltage source, the differences in the temperature variation of the control voltage and the gain stage result in a temperature dependance for the gain factor. The present invention adds additional circuitry to drive the bases of the Gilbert Gain Cell transistor pairs. The new circuitry adds a gain stage where the bias current is proportional to temperature and a stage with a bias current which is constant over temperature. This allows the circuit to retain the exponential gain function while being temperature independent.

PRIOR ART

Figure 1:
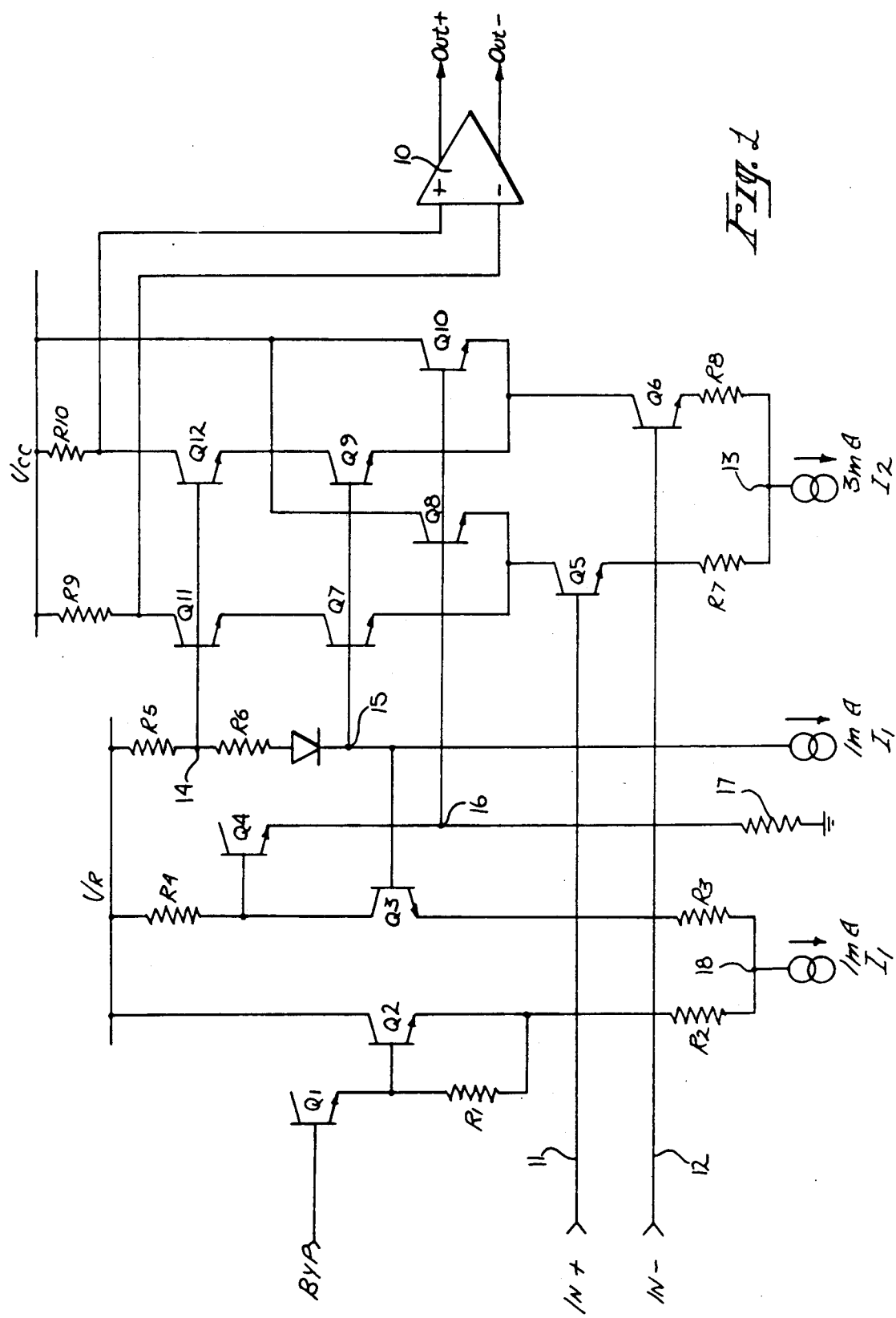
FIG. 1 is a circuit diagram illustrating a prior art AGC amplifier circuit.

A circuit diagram illustrating a prior art AGC amplifier is shown in FIG. 1. The prior art AGC circuit consists of first and second gain stages consisting of first and second pairs of the emitter coupled transistors. As shown in FIG. 1, emitter coupled transistor pairs Q7 and Q8 comprise one gain stage and emitter coupled transistors Q9 and Q10 comprise a second gain stage. Supply voltage VCC is coupled through resistor R9 to a collector of transistor Q11 and to the inverting input of amplifier 10. VCC is also coupled through resistor R10 to the collector of resistor Q12 and to the non inverting input of amplifier 10. The emitter of transistor Q11 is coupled to the collector of transistor Q7. Transistor Q7 is emitter coupled to transistor Q8 whose collector coupled to supply voltage VCC.

The emitter of transistor Q12 is coupled to transistor Q9. Transistor Q9 is emitter coupled to transistor Q10. The collector of transistor of Q10 is coupled to supply voltage VCC. The emitters of transistor Q7 and Q8 are coupled to the collector of transistor Q5. The emitters of transistor pair Q9 and Q10 are coupled to the collector of transistor Q6. Transistor Q5 is base coupled to the IN PLUS signal 11 and transistor Q6 is based coupled to the IN MINUS signal 12. The emitters of transistors Q5 and Q6 are coupled through transistors R7 and R8 respectively to node 13 to generate current $I_2$.

A reference voltage $V_R$ is coupled to resistor R5 to the bases of transistors Q11 and Q12 at node 14, node 14 is coupled through resistor R6 and diode D1 to the bases of transistors of Q7 and Q9 and node 15. Current $I_R$ is taken from node 15.

The reference voltage VR is coupled through resistor R4 to the base of transistor Q4 and to the collector of transistor of Q3. The emitter of transistor Q4 is coupled to the base of Q8 and Q10 at node 16. Node 16 is coupled through resistor 17 to ground.

The base of transistor Q3 is coupled to node 15. VR is coupled to the collector of transistor Q2. The emitters of transistors Q2 and Q3 are coupled through resistors R2 and R3 to node 18 to produce current output $I_1$. The BYP input is coupled to the base of transistor Q1. The emitter of transistor Q1 is coupled to the base of transistor Q2 and through resistor R1 to the emitter of transistor Q2.

In operation, the emitter coupled transistor pairs Q7, Q8, Q9 and Q10 shunt the signal away from load resistors R9 and R10 to vary the gain of the circuit. However, the gain factor is temperature dependant requiring a temperature varying voltage function in order to achieve a specific gain when a external voltage source is used. If transistor Q7–Q10 were not present in the circuit of FIG. 1, the gain would be given by the ratio of transistors R9 and R7 as follows:

$$\text{gain}\left(\frac{\text{out}}{\text{in}}\right) \approx \frac{R_9}{R_1} \cdot (\text{gain of stage2}) \approx 400$$

The resistor ratio value is given by way of example only for purposes of this application. It will be understood that other resistor ratios may be employed as well.

The effect of transistors Q7–Q10 is to reduce the gain of the first gain stage. The ratio of current through Q7 or Q9 to the available current in transistors Q5 and Q6, multiplied by the maximum gain (R9/R7) is the gain of the first stage. Therefore:

$$\text{gain}\left(\frac{\text{out}}{\text{in}}\right) = \frac{I_{cQ7}}{I_{cQ5}} \cdot \frac{R_9}{R_7} \cdot 20 \approx 400 \cdot \frac{I_{cQ7}}{I_{cQ5}}$$

To show the temperature dependance of the external voltage BYP:

Find $I_{cQ7}/I_{cQ5}$ as a function of $V_{byp}$

Initially, $V_{byp} - 2V_{be} - I_{cQ2} \cdot R_2 = V_R - I_1 \cdot (R_5 + R_6) - 2V_{be} - I_{cQ3}R_3$.

For practical applications, $b_e$ is very small and can be removed from the equation, therefore:
Assume small variation in $V_{be}$, then:

$$V_{byp} - I_{cQ2} \cdot R_2 = V_R - I_1 \cdot (R_5 + R_6) - I_{cQ3}R_3$$

$$I_{cQ2} + I_{cQ3} = I_1 => I_{cQ2} = I_1 - I_{cQ3}$$

Finding for $I_{cQ3}$ $$V_{byp} - (I_1 - I_{cQ3})R_2 = V_R - I_1(R_5 + R_6) - I_{cQ3}R_3$$
$$V_{byp} - I_1R_2 + I_{cQ3}R_2 = V_R - I_1R_5 - I_1R_6 - I_{cQ3}R_3$$
$$I_{cQ3}(R_2 + R_3) = V_R - V_{byp} + I_1(R_2 - R_5 - R_6)$$

$$I_{cQ3} = \frac{V_R - V_{byp} + I_1(R_2 - R_5 - R_6)}{(R_2 + R_3)}$$

Now we find the ratio of $I_{cQ7}/I_{cQ5}$ as a function of the base voltages.

$$V_{bQ7} - V_{beQ7} = V_{bQ8} - V_{beQ8}$$

$$V_{bQ7} - V_{bQ8} = V_{beQ7} - V_{beQ8} = V_T\ln\frac{I_{cQ7}}{I_s} - V_T\ln\frac{I_{cQ8}}{I_s}$$

-continued $$V_{bQ7} - V_{bQ8} = V_T \ln \frac{I_{cQ7}}{I_{cQ8}}$$

$$\frac{I_{CQ7}}{I_{CQ8}} = e^{[\frac{V_{beQ7}-V_{beQ8}}{V_T}]}$$

$$I_{cQ7} + I_{cQ8} = I_{cQ5}$$

$$I_{cQ8} = I_{cQ5} - I_{cQ7}$$

$$\frac{I_{cQ7}}{I_{cQ5} - I_{cQ7}} = e^{[\frac{V_{bQ7}-V_{bQ8}}{V_T}]}$$

$$\frac{I_{cQ7}}{I_{cQ5}} = \frac{e^{[\frac{V_{bQ7}-V_{bQ8}}{V_T}]}}{1 + e^{[\frac{V_{bQ7}-V_{bQ8}}{V_T}]}}$$

Next, finding the base voltages of the transistors as a function of the external voltage we find $$V_{bQ7} = V_R - I_1(R_5 + R_6) - V_{be}$$
$$V_{bQ8} = V_R - I_{cQ3}R_4 - V_{be}$$
$$V_{bQ7} - V_{bQ8} = I_{cQ3}R_4 - I_1(R_5 + R_6)$$

$$V_{bQ7} - V_{bQ8} = \frac{R_4}{R_2 + R_3}(V_R - B_{byp} + I_1(R_2 - R_5 - R_6)) - I_1(R_5 + R_6)$$

For purposes of this example, the following nominal values are used $R_2 = 1400$; $R_3 = 1400$; $R_4 = 500$; $R_5 = 200$; $R_6 = 200$ and $I_1 = 1$ milliamp.

$$\frac{I_{cQ7}}{I_{cQ5}} = \frac{e^{[\frac{.179(V_R - V_{byp}) - .221}{V_T}]}}{1 + e^{[\frac{.179(V_R - V_{byp}) - .221}{V_T}]}}$$

The gain is equal to approximately $400 * I_{CQ7}/I_{CQ5}$. The variation of $V_t$ is shown at various temperatures in the following table. The gain values for $V_{BYP}$ at different temperatures levels is shown.

| | for $V_R = 5.4$ | | | |
|---|---|---|---|---|
| | Temp. = 273° K. | Temp. = 298° K. | Temp. = 343° K. | Temp. = 423° K. |
| $V_{BYP}$ | $V_T = .024$ Gain | $V_T = .026$ Gain | $V_T = .030$ Gain | $V_T = .037$ Gain |
| 4.6 | 15 | 19 | 28 | 44 |
| 4.5 | 30 | 36 | 48 | 66 |
| 4.4 | 59 | 66 | 79 | 97 |
| 4.3 | 107 | 113 | 124 | 137 |

As can been seen, the gain varies wildly over temperature by as much as a factor of 3 at higher voltages of $V_{BYP}$.

To make the gain independent of temperature, the quantity of $V_{bQ7}$ minus $V_{bQ8}$ must also be temperature dependant to cancel the temperature dependance of Vt and the denominator of the gain equation and thereby making gain independent of temperature. For example, if:

$$V_{bQ7} - V_{bQ8} = K_1 T[(V_R - V_{byp}) + C]$$

-continued $$\text{Gain} = \frac{400 \cdot e^N}{1 + e^N}$$

Then:

$$N = \left[ \frac{K_1 T((V_R - V_{byp}) + C)}{\frac{KT}{q}} \right]$$

If $K_1$ and C are constants then:

$$N = \left[ \frac{K_1 q}{K} ((V_R - V_{byp}) + C) \right]$$

which is temperature independent, making the gain:

$$\text{Gain} = \frac{400 \cdot e^N}{1 + e^N}$$

temperature independent as well.

THE PRESENT INVENTION

Figure 2:
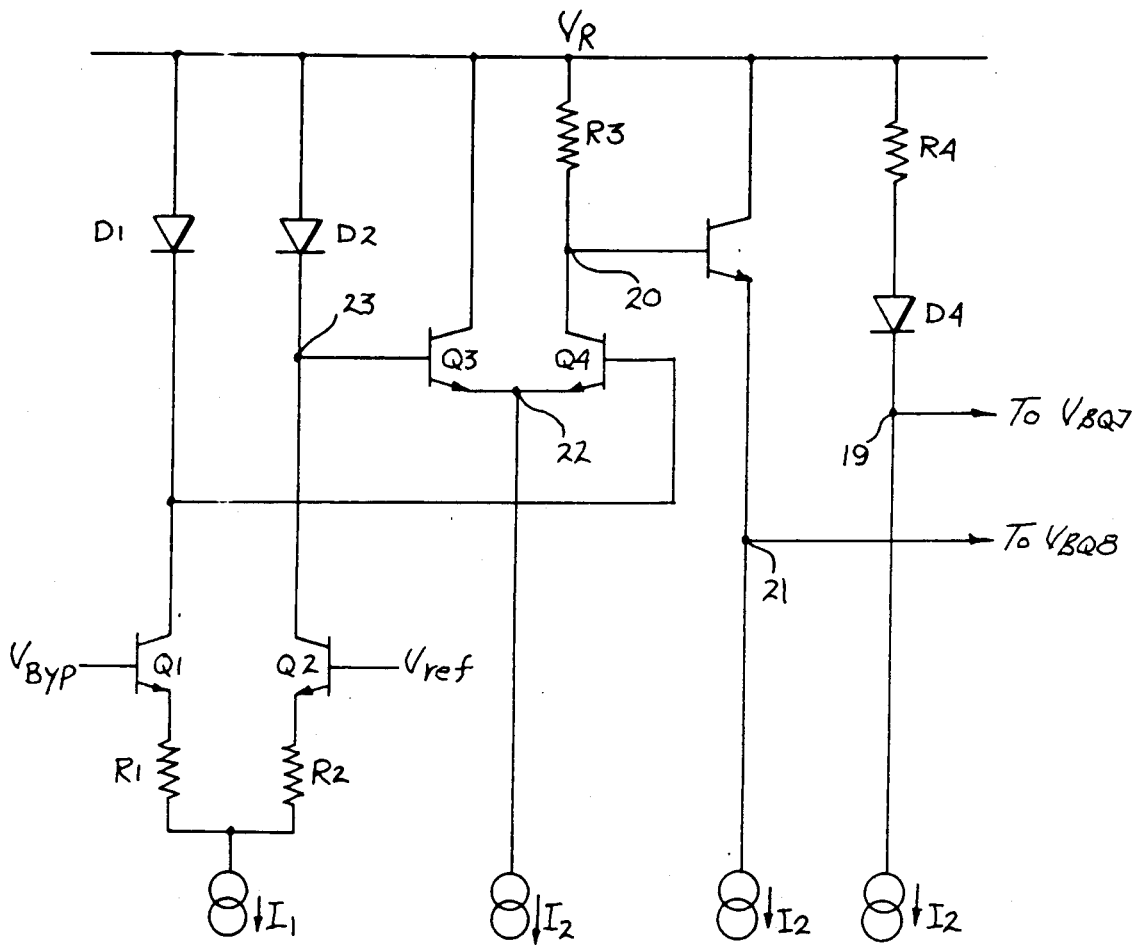
FIG. 2 is a circuit diagram illustrating gain stages of the present invention.

The present invention provides new circuitry in the control path for driving the bases of transistor Q7 and Q8. The circuitry of the present invention adds additional gain stages to the AGC. One of these gain stages is temperature independent while the second gain stage is temperature dependent. This temperature dependent gain stage affects the numerator of the exponential function of the AGC circuit so that the temperature dependent terms in the numerator and denominator cancel each other out, making the entire circuit temperature independent. The additional circuitry of the present invention is illustrated in FIG. 2. Reference voltage $V_R$ is coupled through resistor R4 and diode D4 to the base of transistor Q7 at node 19. The referenced $V_R$ is also coupled through resistor R3 to the base of transistor Q3 at node 20. The emitter of transistor Q3 is coupled to the base of Q8 at node 21.

Node 20 is also coupled to the collector of transistor Q4. Voltage reference $V_R$ is coupled to the collector of transistor Q3 and transistor Q3 is emitter coupled to transistor Q4 at node 22. The current $I_2$ is taken from nodes 22, 21 and 19 and is equivalent at each node.

The reference voltage is coupled through diode D2 to the base of transistor Q3 at node 23. $V_R$ is also coupled through diode D1 to the base of transistor Q4 at node 24. Node 24 and 23 are coupled to the collectors of transistors of Q1 and Q2 respectfully. The base of transistor Q1 is coupled to $V_{byp}$ and the base of transistor Q2 is coupled $V_{Ref}$. The emitters of transistors Q1 and Q2 are coupled through resistors R1 and R2 respectful to node 25. Current $I_1$ is taken from node 25.

The additional gain stage of the circuitry of FIG. 2 consists of transistors Q1, Q2, resistors R1, R2 and diodes D1 and D2. This first gain stage is temperature independent. The second gain stage consists of transistors Q3 and Q4 and resistor R3. The bases of transistors Q3 and Q4 are driven by the first gain stage.

Solving for $V_{bQ7}$ minus $V_{bQ8}$ for the present circuit yields:

$$V_{byp} - V_{beQ1} - I_{cQ1}R_1 = V_{Ref} - V_{beQ2} - I_{cQ2}R_1$$

Assuming that $\Delta V_{be}$ is small then:

$$V_{byp} - V_{Ref} = R_1(I_{cQ1} - I_{cQ2})$$

$$I_{cQ1} - I_{cQ2} = \frac{V_{byp} - V_{Ref}}{R_1}$$

$$I_{cQ1} + I_{cQ2} = I_1$$

$$I_{cQ2} = I_1 - I_{cQ1}$$

$$I_{cQ1} = \frac{I_1}{2} + \frac{V_{byp} - V_{Ref}}{2R_1}$$

$$2I_{cQ1} - I_1 = \frac{V_{byp} - V_{Ref}}{R_1}$$

Likewise:

$$I_{cQ2} = \frac{I_1}{2} - \frac{V_{byp} - V_{Ref}}{2R_1}$$

$$V_{bQ3} - V_{beQ3} = V_{bQ4} - V_{beQ4}$$

$$V_{bQ4} - V_{bQ3} = V_T \ln \frac{I_{cQ4}}{I_{cQ3}}$$

$$I_{cQ4} + I_{cQ3} = I_2$$

$$I_{cQ3} = I_2 - I_{cQ4}$$

$$V_{bQ4} - V_{bQ3} = V_T \ln \frac{I_{cQ4}}{I_2 - I_{cQ4}}$$

$$\frac{I_{cQ4}}{I_2 - I_{cQ4}} = e^{[\frac{V_{bQ4} - V_{bQ3}}{V_T}]}$$

$$I_{cQ4} = \frac{I_2 e^{[\frac{V_{bQ4} - V_{bQ3}}{V_T}]}}{1 + e^{[\frac{V_{bQ4} - V_{bQ3}}{V_T}]}}$$

or:

$$I_{cQ4} = \frac{I_2}{1 + e^{[\frac{V_{bQ3} - V_{bQ4}}{V_T}]}}$$

The denominator of the exponential term is temperature dependent. Solving for $V_{bQ3}$.

$$V_{bQ3} = V_R - V_{D2}$$

$$V_{bQ3} = V_R - V_T \ln \frac{I_{cQ2}}{I_S}$$

Solving for $V_{bQ4}$:

$$V_{bQ4} = V_R - V_{D1}$$

$$V_{bQ4} = V_R - V_T \ln \frac{I_{cQ1}}{I_S}$$

Therefore:

$$V_{bQ3} - V_{bQ4} = V_R - V_T \ln \frac{I_{cQ2}}{I_S} - V_R + V_T \ln \frac{I_{cQ1}}{I_S}$$

$$V_{bQ3} - V_{bQ4} = V_T \ln \frac{I_{cQ1}}{I_{cQ2}}$$

Substitute in:

$$I_{cQ4} = \frac{I_2}{1 + e^{[\frac{V_T \ln \frac{I_{cQ1}}{I_{cQ2}}}{V_T}]}}$$

$$I_{cQ4} = \frac{I_2}{1 + \frac{I_{cQ1}}{I_{cQ2}}}$$

Substitute in for $I_{cQ1}$ and $I_{cQ2}$:

$$I_{cQ4} = \frac{I_2}{1 + \frac{\frac{I_1}{2} + \frac{V_{byp} - V_{Ref}}{2R_1}}{\frac{I_1}{2} - \frac{V_{byp} - V_{Ref}}{2R_1}}}$$

$$I_{cQ4} = \frac{I_2 \left( \frac{I_1}{2} - \frac{V_{byp} - V_{Ref}}{2R_1} \right)}{\frac{I_1}{2} - \frac{V_{byp} - V_{Ref}}{2R_1} + \frac{I_1}{2} + \frac{V_{byp} - V_{Ref}}{2R_1}}$$

$$I_{cQ4} = \frac{I_2}{2} - \frac{I_2}{I_1} + \left( \frac{V_{byp} - V_{Ref}}{2R_1} \right)$$

Solving for $V_{bQ7}$ and $V_{bQ8}$:

$$V_{bQ7} = V_R - I_2 R_4 - V_{beD4}$$
$$V_{bQ8} = V_R - I_{cQ4} \cdot R_3 - V_{beD3}$$
$$V_{bQ7} - V_{bQ8} = I_{cQ4} \cdot R_3 - I_2 R_4$$

$$V_{bQ7} - V_{bQ8} = I_2 \left( \frac{R_3}{2} - R_4 - \frac{R_3}{I_1} \left( \frac{V_{byp} - V_{Ref}}{2R_1} \right) \right)$$

If $I_2$ is a PTAT current source such as $I_2$ equals $K_3 V_t$ and where $K_3$ has units of 1/ohms then:

$$\frac{I_{cQ7}}{I_{cQ5}} = \frac{e^{[\frac{K_3 V_T (\frac{R_3}{2} - R_4 - \frac{R_3}{I_1}(\frac{V_{byp} - V_{Ref}}{2R_1}))}{V_T}]}}{1 + e^{[\frac{K_3 V_T(\frac{R_3}{2} - R_4 - \frac{R_3}{I_1}(\frac{V_{byp} - V_{Ref}}{2R_1}))}{V_T}]}}$$

The $V_t$ terms cancel leaving:

$$\frac{I_{cQ7}}{I_{cQ5}} = \frac{e^{[K_3(\frac{R_3}{2} - R_4 - \frac{R_3}{I_1}(\frac{V_{byp} - V_{Ref}}{2R_1}))]}}{1 + e^{[K_3(\frac{R_3}{2} - R_4 - \frac{R_3}{I_1}(\frac{V_{byp} - V_{Ref}}{2R_1}))]}}$$

Thus, if $I_1$ is constant over temperature then there is no temperature dependence. Therefore, an automatic gain control circuit having an exponential gain control voltage which is temperature independent has been described.

I claim:

1. An automatic gain control (AGC) circuit having first and second gain stages, comprising:
   a third gain stage providing a bias current which is constant over temperature;
   a fourth gain stage for providing a bias current which is proportional to temperature, the output of said fourth gain stage connected to inputs of both said first and second gain stages, the output of said third gain stage coupled to the input of said fourth gain stage.

2. The circuit of claim 1 wherein said first gain stage comprises first and second emitter coupled transistors.

3. The circuit of claim 2 wherein said second gain stage comprises third and fourth emitter coupled transistors.

4. The circuit of claim 3 wherein said third gain stage is coupled to the base of the second and fourth transistors.

5. The circuit of claim 4 wherein said fourth gain stage is coupled to the bases of the first and third transistors.

6. The circuit of claim 5 wherein said third gain stage comprises fifth and sixth transistors having emitters coupled through first and second resistors respectively.

7. The circuit of Claim 6 wherein said fourth gain stage comprises seventh and eighth emitter coupled transistors, the bases of said seventh and eighth transistors driven by said third gain stage.

8. An automatic gain control (AGC) circuit having first and second gain stages, said first gain stage comprising first and second emitter coupled transistors and said second gain stage comprising third and fourth emitter coupled transistors comprising:
   a third gain stage providing a bias current which is constant over temperature, said third gain stage comprising fifth and sixth transistors having emitters coupled through first and second resistors respectively; a fourth gain stage for providing a bias current which is proportional to temperature, said fourth gain stage comprising seventh and eighth emitter coupled transistors; said third and fourth gain stages coupled to said first and second gain stages.

9. The circuit of claim 8 wherein said third gain stage is coupled to the bases of said second and fourth transistors.

10. The circuit of claim 9 wherein said fourth gain stage is coupled to the bases of said first and third transistors.

11. An automatic gain control (AGC) circuit having first gain stage wherein said first gain stage comprises first and second emitter coupled transistors, and having a second gain stage wherein second gain stage comprises third and fourth emitter-coupled transistors, said circuit comprising:
   a third gain stage providing a bias current which is constant over temperature, wherein said third gain stage is coupled to the base of the second and fourth transistors and wherein said third gain stage comprises fifth and sixth transistors having emitters coupled through first and second resistors, respectively;
   a fourth gain stage for providing a bias current which is proportional to temperature, wherein said fourth gain stage is coupled to the base of the first and third transistors, and wherein said fourth gain stage comprises seventh and eighth emitter coupled transistors, the bases of said seventh and eighth transistors driven by said third gain stage, wherein said third and fourth gain stages are coupled to said first and second gain stages.

12. An automatic gain control (AGC) circuit having first gain stage wherein said first gain stage comprises first and second emitter coupled transistors, and having a second gain stage wherein second gain stage comprises third and fourth emitter-coupled transistors said circuit comprising:
   a third gain stage providing a bias current which is constant over temperature, wherein said third gain stage is coupled to the base of the second and fourth transistors;
   a fourth gain stage for providing a bias current which is proportional to temperature, wherein said third and fourth gain stages are coupled to said first and second gain stages.

13. The circuit of claim 12 wherein said fourth gain stage is coupled to the base of the first and third transistors.

14. The circuit of claim 13 wherein said third gain stage comprises fifth and sixth transistors having emitters coupled through first and second resistors, respectively.

15. The circuit of claim 14 wherein said fourth gain stage comprises seventh and eighth emitter coupled transistors, the basis of said seventh and eighth transistors driven by said third gain stage.

* * * * *